United States Patent
Bonifield et al.

(10) Patent No.: US 11,222,945 B2
(45) Date of Patent: Jan. 11, 2022

(54) HIGH VOLTAGE ISOLATION STRUCTURE AND METHOD

(71) Applicant: Texas Instruments Incorporated, Dallas, TX (US)

(72) Inventors: Thomas Dyer Bonifield, Dallas, TX (US); Kannan Soundarapandian, Southlake, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/857,778

(22) Filed: Dec. 29, 2017

(65) Prior Publication Data
US 2019/0206981 A1    Jul. 4, 2019

(51) Int. Cl.
*H01L 21/60* (2006.01)
*H01L 29/06* (2006.01)
(Continued)

(52) U.S. Cl.
CPC ............ *H01L 28/60* (2013.01); *H01G 4/012* (2013.01); *H01G 4/08* (2013.01); *H01G 4/30* (2013.01); *H01L 21/02164* (2013.01); *H01L 21/283* (2013.01); *H01L 21/762* (2013.01); *H01L 21/768* (2013.01); *H01L 23/528* (2013.01); *H01L 23/5223* (2013.01); *H01L 23/5226* (2013.01); *H01L 23/60* (2013.01); *H01L 29/0649* (2013.01); *H01L 23/53257* (2013.01); *H01L 24/05* (2013.01); *H01L 24/45* (2013.01); *H01L 24/48* (2013.01); *H01L 27/0629* (2013.01); *H01L 2224/04042* (2013.01);
(Continued)

(58) Field of Classification Search
CPC ........... H01L 21/0214; H01L 21/02164; H01L 21/0217; H01L 21/823481; H01L 27/0629; H01L 28/40; H01L 28/60; H01L 28/91; H01L 29/0692; H01L 29/66477; H01L 29/78; H01L 29/7833; H01L 28/00; H01L 23/522; H01L 23/5225; H01L 21/283; H01L 21/762; H01L 23/5223; H01L 23/5226; H01L 23/28; H01L 23/60; H01L 23/53257; H01L 24/45; H01G 4/012; H01G 4/08; H01G 4/30
See application file for complete search history.

(56) References Cited

U.S. PATENT DOCUMENTS 5,618,749 A    4/1997 Takahashi et al.
5,814,875 A    9/1998 Kumazaki
(Continued)

FOREIGN PATENT DOCUMENTS

WO    2017137864 A1    8/2017

OTHER PUBLICATIONS

Patent Cooperation Treaty Search Report, dated Apr. 11, 2019, International Application No. PCT/US 2018/068121.

*Primary Examiner* — Mohammed Shamsuzzaman
(74) *Attorney, Agent, or Firm* — Jacqueline J. Garner; Charles A. Brill; Frank D. Cimino

(57) ABSTRACT

Described examples include a microelectronic device with a high voltage capacitor that includes a high voltage node, a low voltage node, a first dielectric disposed between the low voltage node and the high voltage node, a first conductive plate disposed between the first dielectric and the high voltage node, and a second dielectric disposed between the first conductive plate and the high voltage node.

17 Claims, 7 Drawing Sheets

(51) Int. Cl.
*H01L 49/02* (2006.01)
*H01G 4/012* (2006.01)
*H01G 4/08* (2006.01)
*H01L 21/283* (2006.01)
*H01L 21/02* (2006.01)
*H01L 21/762* (2006.01)
*H01L 23/528* (2006.01)
*H01L 23/522* (2006.01)
*H01L 23/60* (2006.01)
*H01G 4/30* (2006.01)
*H01L 21/768* (2006.01)
*H01L 23/532* (2006.01)
*H01L 27/06* (2006.01)
*H01L 23/00* (2006.01)

(52) U.S. Cl.
CPC .............. *H01L 2224/05567* (2013.01); *H01L 2224/05624* (2013.01); *H01L 2224/48463* (2013.01)

(56) References Cited

U.S. PATENT DOCUMENTS

| | | | | |
|---|---|---|---|---|
| 6,188,121 B1* | 2/2001 | Baldi | ................. | H01L 27/0805 257/532 |
| 6,423,584 B2 | 7/2002 | Takahashi | | |
| 6,441,419 B1 | 8/2002 | Johnson et al. | | |
| 6,838,717 B1* | 1/2005 | Yen | ................. | H01L 23/5223 257/295 |
| 6,977,198 B2 | 12/2005 | Gau | ................. | H01L 23/5223 257/E21.011 |
| 7,041,569 B1* | 5/2006 | Kar-Roy | ............ | H01L 27/0805 257/E21.008 |
| 7,312,118 B2* | 12/2007 | Kiyotoshi | ........... | H01L 21/8221 257/E21.012 |
| 8,101,477 B1 | 1/2012 | Power | | |
| 8,405,189 B1* | 3/2013 | Ward | ................. | H01L 28/40 257/532 |
| 8,759,947 B2* | 6/2014 | Tan | ................. | H01L 23/481 257/532 |
| 8,890,223 B1* | 11/2014 | Bonifield | ........... | H01L 27/0288 257/296 |
| 8,921,988 B2 | 12/2014 | Hsu | | |
| 9,041,148 B2* | 5/2015 | Jakushokas | ............ | H01L 28/60 257/516 |
| 9,087,853 B2 | 7/2015 | Tao et al. | | |
| 9,299,697 B2* | 3/2016 | West | ................. | H01L 28/91 |
| 9,768,245 B2 | 9/2017 | West et al. | | |
| 9,793,203 B2* | 10/2017 | Tao | ................. | H01L 23/5223 |
| 2002/0179974 A1 | 12/2002 | Noda | | |
| 2003/0231455 A1* | 12/2003 | Devoe | .................. | H01G 4/30 361/301.3 |
| 2005/0215022 A1 | 9/2005 | Adam et al. | | |
| 2006/0077713 A1 | 4/2006 | Ito et al. | | |
| 2006/0145251 A1 | 7/2006 | Ko | | |
| 2006/0189089 A1 | 8/2006 | Larkin et al. | | |
| 2007/0183191 A1 | 8/2007 | Kim | | |
| 2007/0230090 A1* | 10/2007 | Kumagai | ............... | H01G 4/228 361/328 |
| 2007/0296085 A1* | 12/2007 | Coolbaugh | ............ | H01L 28/60 257/758 |
| 2008/0185682 A1* | 8/2008 | Alter | ....................... | H01G 4/228 257/532 |
| 2009/0095995 A1 | 4/2009 | Kawashima et al. | | |
| 2009/0108323 A1 | 4/2009 | Jee et al. | | |
| 2010/0032741 A1 | 2/2010 | Ueno | | |
| 2010/0052084 A1 | 3/2010 | Yang | | |
| 2010/0059851 A1 | 3/2010 | Ellis et al. | | |
| 2011/0032660 A1* | 2/2011 | Dunn | .................. | H01G 4/1209 361/313 |
| 2011/0086487 A1* | 4/2011 | Baumgartner | ...... | H01L 23/5223 438/381 |
| 2011/0244666 A1 | 10/2011 | Kim et al. | | |
| 2012/0146124 A1 | 6/2012 | Hafez et al. | | |
| 2012/0162947 A1 | 6/2012 | O'Donnell et al. | | |
| 2012/0205251 A1 | 8/2012 | Kalkan | | |
| 2012/0211868 A1 | 8/2012 | Stribley et al. | | |
| 2013/0001738 A1 | 1/2013 | Dong | | |
| 2013/0037909 A1 | 2/2013 | French et al. | | |
| 2013/0270675 A1* | 10/2013 | Childs | ................. | H01L 23/5226 257/532 |
| 2014/0145297 A1* | 5/2014 | Daamen | ............. | H01L 23/5223 257/507 |
| 2014/0145301 A1 | 5/2014 | Moghe et al. | | |
| 2014/0252551 A1* | 9/2014 | Dix | ....................... | H01L 23/642 257/532 |
| 2014/0253227 A1* | 9/2014 | Yach | ................. | H04L 25/4902 327/540 |
| 2014/0264740 A1 | 9/2014 | Stribley | | |
| 2014/0312296 A1 | 10/2014 | Jo et al. | | |
| 2015/0041190 A1* | 2/2015 | Bonifield | ................. | H05K 1/162 174/257 |
| 2015/0115407 A1* | 4/2015 | Tao | ....................... | H01L 23/481 257/532 |
| 2015/0187781 A1 | 7/2015 | Hong et al. | | |
| 2015/0200307 A1 | 7/2015 | Matsuo et al. | | |
| 2015/0214292 A1 | 7/2015 | Tao et al. | | |
| 2015/0294726 A1 | 10/2015 | Sim et al. | | |
| 2016/0260796 A1 | 9/2016 | Levin | | |
| 2017/0263696 A1 | 9/2017 | West et al. | | |

\* cited by examiner

HIGH VOLTAGE ISOLATION STRUCTURE AND METHOD

BACKGROUND

High voltage isolation capacitors are limited in voltage rating by the high electric field which occurs at the bottom edges of the metal that forms the high voltage capacitor metal. To prevent dielectric breakdown, high voltage capacitors can be oversized relative to the requirements of a given operating voltage level. However, oversized capacitors or other high voltage components occupy excessive microelectronic device area.

SUMMARY

Described examples provide microelectronic devices with a high voltage component, including a high voltage node, a low voltage node, a first dielectric between the high and low voltage nodes, a first conductive plate between the first dielectric and the high voltage node, and a second dielectric disposed between the first conductive plate and the high voltage node.

A further disclosed example provides a capacitor, including a conductive first capacitor plate disposed above a substrate, a first dielectric disposed over the conductive lower plate, and a conductive first floating plate disposed over the first dielectric. The first floating plate is electrically isolated from the first capacitor plate. The capacitor also includes a second dielectric disposed over the first floating plate, and a conductive second capacitor plate disposed over the second dielectric, where the second capacitor plate is electrically isolated from the first floating plate.

Further examples provide a method of forming a microelectronic device, including forming a conductive first capacitor plate above a substrate, forming a first dielectric over the conductive lower plate, forming a conductive first floating plate over the first dielectric, forming a second dielectric over the first floating plate, and forming a conductive second capacitor plate over the second dielectric.

DETAILED DESCRIPTION

Figure 1:
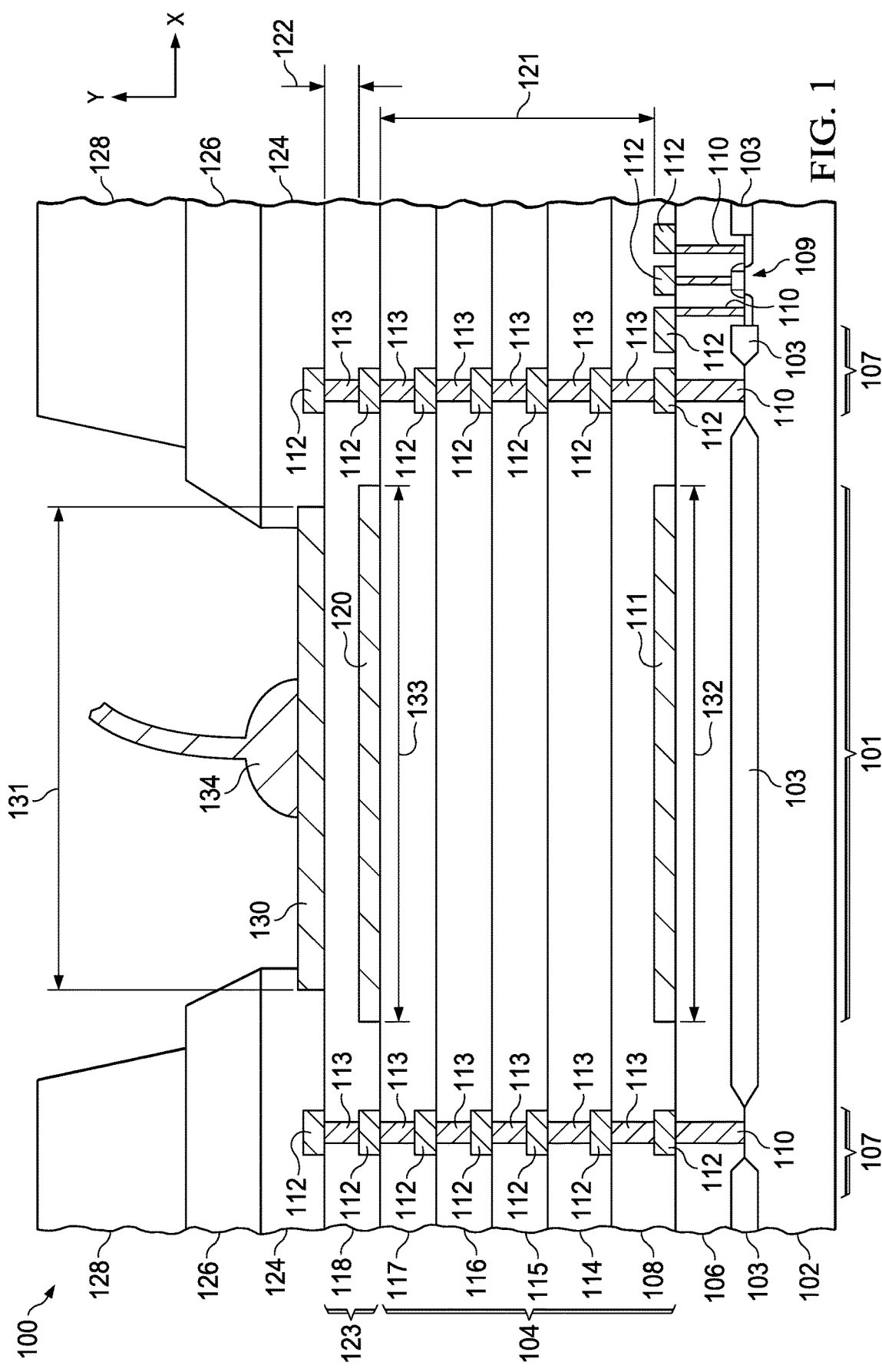
FIG. 1 is a partial sectional side elevation view of an example microelectronic device including a high voltage capacitor with a floating plate between high and low voltage, upper and lower capacitor plates.

In the drawings, like reference numerals refer to like elements throughout, and the various features are not necessarily drawn to scale.

FIG. 1 shows a microelectronic device 100 that includes a high voltage component 101. In one example, the high voltage component 101 is a vertical high voltage capacitor formed in an integrated circuit (IC) device together with one or more additional components. In some examples, the capacitor 101 is a standalone component, or part of a hybrid circuit. The device 100 in FIG. 1 is formed on a semiconductor substrate 102, such as a silicon wafer, a silicon-on-insulator (SOI) substrate or other semiconductor structure. One or more isolation structures 103 are formed on select portions of the upper surface of the substrate 102. The isolation structures 103 can be shallow trench isolation (STI) features or field oxide (FOX) structures in some examples. In one example, the high voltage capacitor 101 is formed in a multi-layer metallization structure above the substrate 102. The metallization structure includes a first dielectric structure 104 formed above the substrate 102. In one example, the first dielectric 104 is a multi-layer structure. The first dielectric 104 in one example is disposed above a pre-metal dielectric (PMD) layer 106 In one example, the PMD layer 106 includes silicon dioxide ($SiO_2$) deposited over the substrate 102 and the field oxide structures 103. In the illustrated example, a conductive faraday cage structure 107 is formed above the substrate 102 to encircle all or a portion of the high voltage capacitor device 101. The faraday cage structure 107 forms an isolation break in the first dielectric 104 so that the first dielectric 104 is not continuous at the isolation break. In one example, the isolation break faraday cage structure 107 laterally surrounds all or at least a portion of the high voltage capacitor 101.

In one example, the first dielectric 104 is a multi-layer structure. In one example, the multi-layer structure is formed as a multi-layer metallization structure using integrated circuit fabrication processing. FIG. 1 shows an example 6 layer dielectric structure, including a first layer 108, referred to herein as an interlayer or interlevel dielectric (ILD) layer. Different numbers of layers can be used in other implementations. In one example, the individual layers of the first dielectric are formed of silicon dioxide ($SiO_2$) or other suitable dielectric material. In certain implementations, the individual layers of the multi-layer first dielectric 104 are formed in two stages, including an intra-metal dielectric (IMD) sub layer and an ILD sublayer overlying the IMD sub layer. The individual IMD and ILD sublayers can be formed of any suitable dielectric material or materials, such as $SiO_2$-based dielectric materials. The example microelectronic device 100 is an integrated circuit that includes the high voltage capacitor component 101 and one or more low voltage components, such as a metal oxide semiconductor (MOS) transistor 109 formed on or in the substrate 102. Tungsten or other conductive contacts 110 are formed through selective portions of the PMD layer 106, including contacts to form a bottom connection of the faraday cage structure 107 to the substrate 102, as well as contacts to the terminals of the transistor 109.

Figure 5:
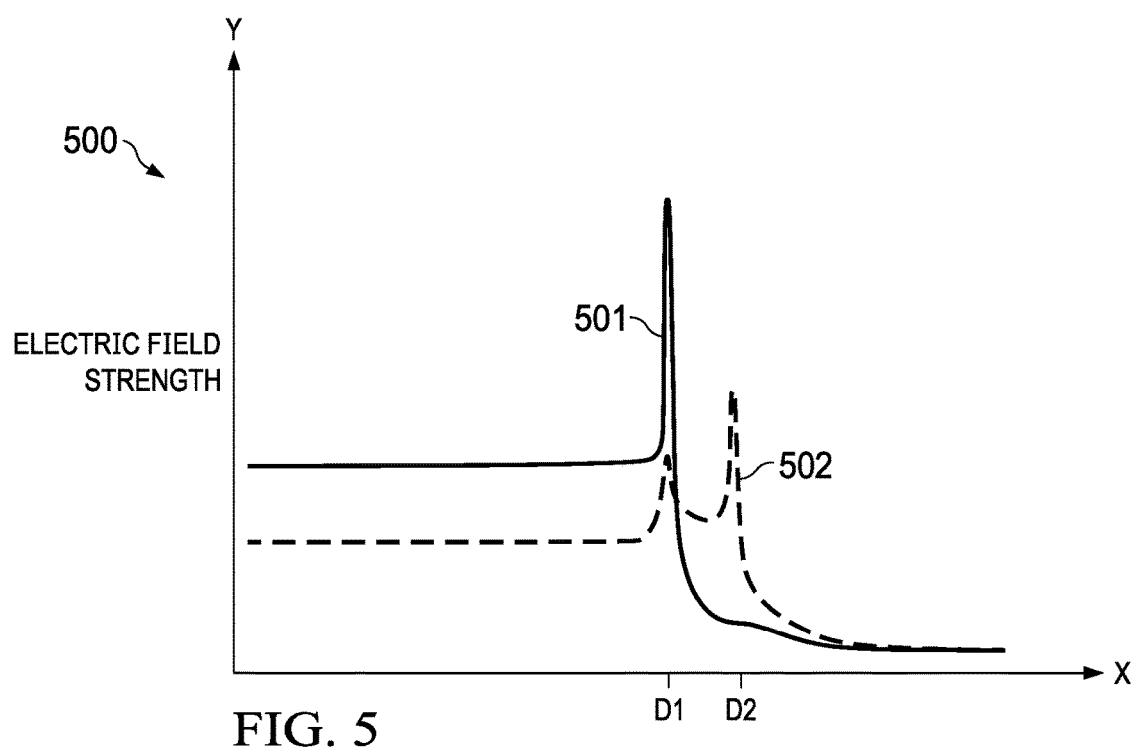
FIG. 5 is a graph of electric field strength as a function of lateral distance in the capacitor dielectric beneath the high voltage capacitor plate of FIG. 4.

A low voltage node 111 of the high voltage capacitor 101 is formed as a conductive first capacitor plate above the substrate 102. The low voltage node 111 provides a bottom capacitor plate in the example vertical capacitor structure 101. The low voltage node 111 in one example is aluminum or other suitable conductive material formed over a portion of the PMD layer 106 as part of a multi-level metallization process during integrated circuit fabrication. The first layer 108 of the first dielectric structure 104 covers the conductive low voltage node 111. The low voltage node 111 in certain implementations is electrically connected to one or more additional circuit components within the microelectronic device 100. In one example, the capacitor 101 is used as an isolation capacitor for communicating with an external circuit (not shown), and the lower voltage capacitor plate is connected to transceiver circuitry (not shown) within the microelectronic device 100. In this example, a high voltage capacitor plate described further hereinbelow is connected to the external circuit to allow communications across a voltage potential barrier. The low voltage node 111 can be formed from the first level or method as shown in FIG. 5, or in any other metal layer in various implementations.

The first ILD layer 108, and the subsequent ILD layers in the multi-layer first dielectric structure 104 include metallization interconnect structures 112, such as aluminum formed on the top surface of the underlying layer. In this example, the first layer 108 also includes conductive vias 113, such as tungsten, providing electrical connection from the metallization features 112 of the layer 108 to an overlying metallization layer. FIG. 1 shows a seven-layer metallization structure, although any number of metallization layers can be used. In the illustrated example, a second layer 114 is formed over the first layer 108, and includes conductive interconnect structures 112 and vias 113. The illustrated structure includes further metallization levels with corresponding dielectric layers, 115, 116, 117 and 118. The individual layers 115-118 include conductive interconnect structures 112 and associated vias 113. In this example, the faraday cage structure 107 is formed by successive connection of the substrate 102 through the tungsten contacts 110, interconnect structures 112 and vias 113 to generally encircle and electrically isolate the high voltage capacitor 101 from other circuits within the microelectronic device 100. In this manner, the transistor 109 and other low-voltage components can be electrically isolated from the high voltage nodes and other high voltage features of the capacitor 101. In addition, the first dielectric 104, including the layers 108 and 114-117 within the isolation break provided by the conductive structures 110, 112 and 113 of the faraday cage structure 107 provides a first dielectric for the high voltage capacitor 101.

The capacitor 101 further includes a conductive first floating plate 120 disposed over the first dielectric 104. In the illustrated example, the first floating plate 120 is a conductive plate, such as aluminum, formed as part of the metallization level features in the dielectric level 118. The conductive floating plate 120 enhances the capacitance density of the microelectronic device. The first floating plate 120 is electrically isolated from the first capacitor plate 111 and from the upper capacitor plate. In one example, the floating plate 120 is entirely encapsulated by the dielectric material layers 117 and 118. The first dielectric 104 in this example has a first thickness 121 between the lower surface of the floating plate 120 and the upper surface of the low voltage node 111 (in the Y direction in FIG. 1).

The high voltage capacitor 101 further includes a second dielectric 123 disposed over the first floating plate 120. In this example, the second dielectric 123 is formed by the portion of the dielectric layer 118 that overlies the first floating plate 120. The capacitor 101 also includes a conductive second or upper capacitor plate 130 disposed over the second dielectric 123. In the illustrated example, the second capacitor plate 130 is a conductive plate, such as aluminum, formed over the top surface of the second dielectric 123. The second capacitor plate 130 is electrically isolated from the first capacitor plate 111 and from the floating plate 120. The second dielectric 123 above the floating plate 120 has a thickness 122 (along the Y direction) between the upper surface of the first floating plate 120 and the lower surface of the high voltage node 130. The first and second thicknesses 121 and 122 can be the same. In certain examples, the first thickness 121 is different than the second thickness 122. In the example of FIG. 1, the first thickness 121 is significantly larger than the second thickness 122. The thicknesses 121 and 122 of the capacitor dielectric 104, 123 in one example is at least 2 μm, and may be determined by a desired operating voltage of the high voltage node 130 relative to the low voltage node 111 and possibly the substrate 102. For example, a version of the high voltage capacitor 101 in which the high voltage node 130 is designed to operate at 1000 volts may have a capacitor dielectric 104, 123 with a combined thickness of the layers 121 and 122 of 5 microns to 20 microns.

The microelectronic device 100 further includes an upper IMD dielectric layer 124 and protective overcoat (PO) layers 126 and 128, for example, silicon nitride (SiN), silicon oxynitride ($SiO_xN_y$), or silicon dioxide ($SiO_2$). In one example, the layers 124, 126 and 128 include an opening that allows connection of a bond wire structure 134 to an upper surface of the second capacitor plate 134 connection to an external circuit (not shown). In this example, the second capacitor plate 130 provides a high voltage node of the high voltage capacitor 101.

As shown in FIG. 1, the high voltage capacitor 101 includes the high voltage node 130 (e.g., a conductive upper capacitor plate) and a low voltage node 111 (e.g., a conductive lower capacitor plate) separated by a first dielectric 104 disposed between the low voltage node 111 and the high voltage node 130. The high voltage component 101 in FIG. 1 includes a first conductive plate 120 disposed between the first dielectric 104 and the high voltage node 130. In addition, the high voltage component 101 includes a second dielectric 123 disposed between the first conductive plate 120 and the high voltage node 130. In one example, the first conductive plate 120 is floating, and is electrically isolated from the low voltage node 111 and the high voltage node 130.

The high voltage node 130 is isolated from the low voltage node 111 by the first and second dielectrics 104 and 123, and the capacitor structure 101 includes the added floating plate 120 between the high voltage node 130 and the low voltage node 111. In operation, the provision of the conductive floating plate 120 between the capacitor plates 111 and 130 modifies the electric field distribution in the capacitor dielectric materials 104 and 123.

Figure 2:
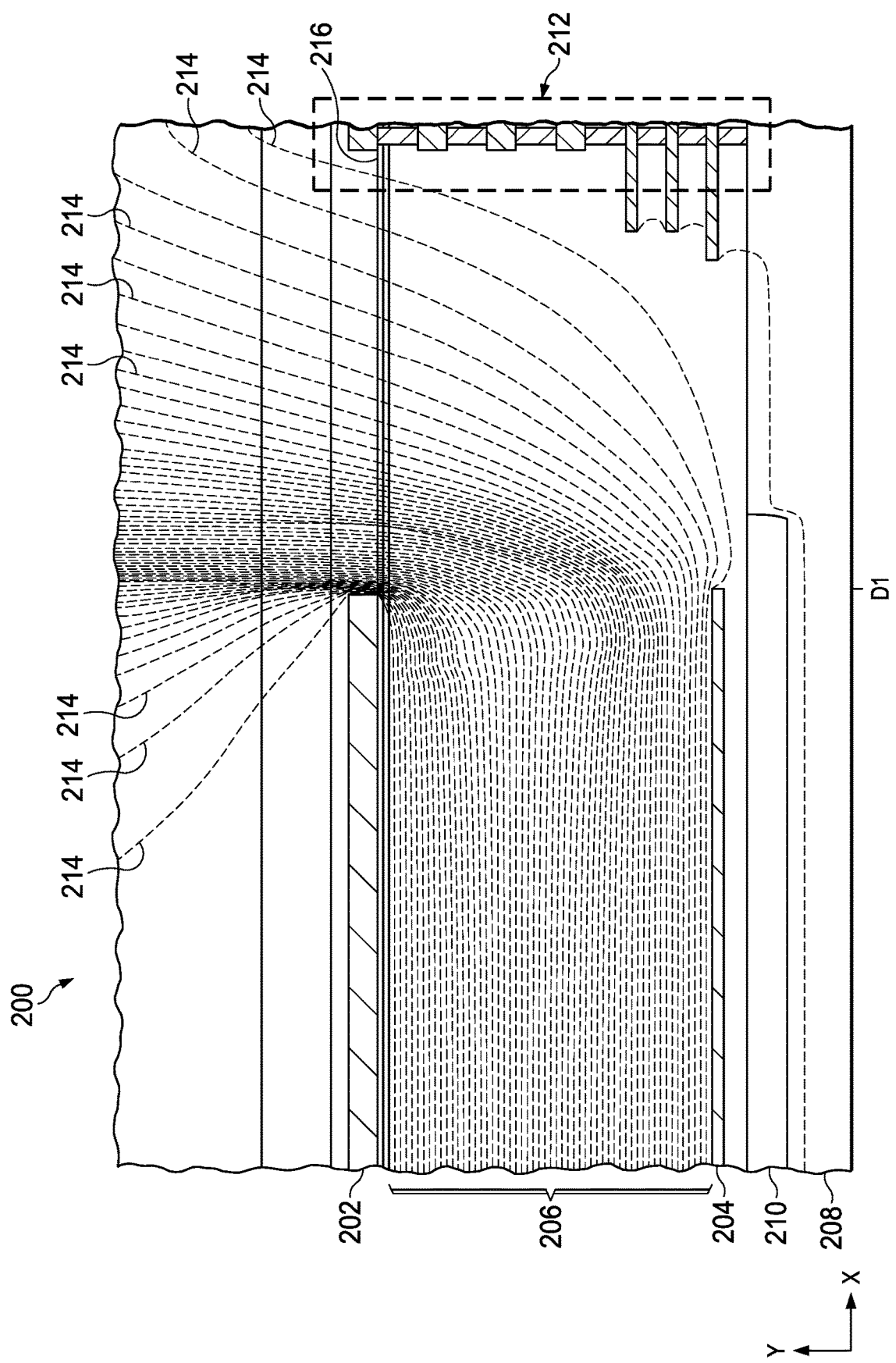
FIG. 2 is a partial sectional side elevation view of another microelectronic device with a high voltage capacitor illustrating equipotential lines that show high electric field strength at the corner of the high voltage capacitor plate.
Figure 3:
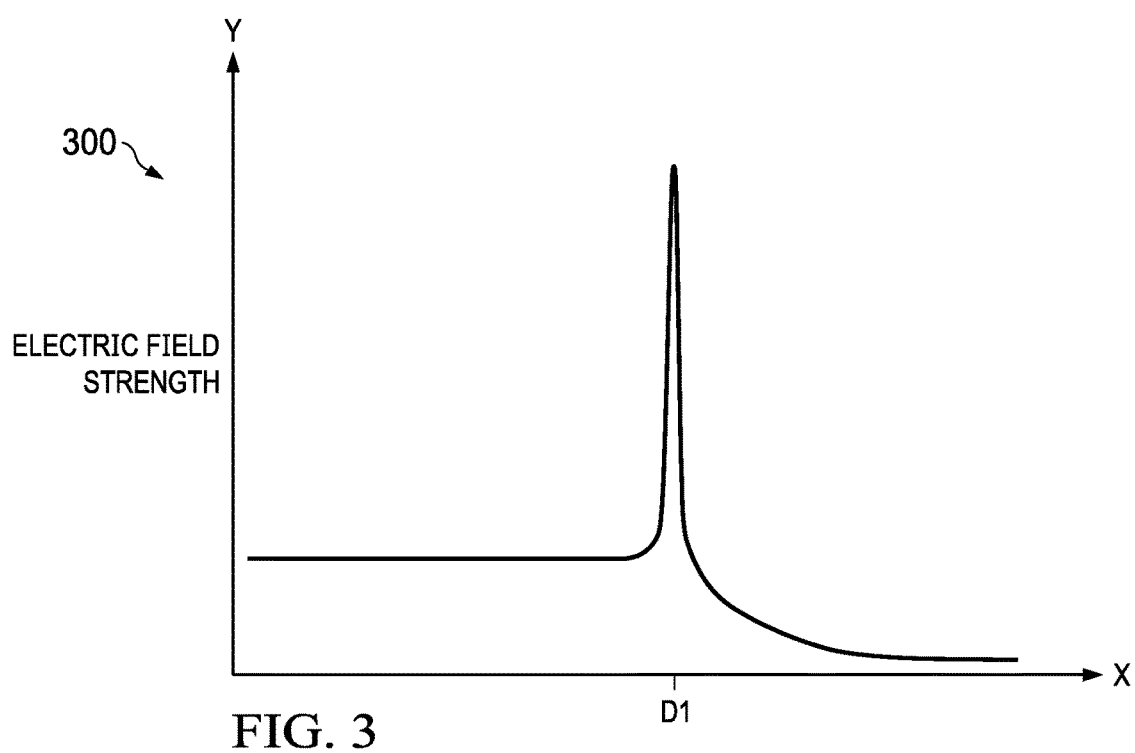
FIG. 3 is a graph of electric field strength as a function of lateral distance in the capacitor dielectric beneath the high voltage capacitor plate of FIG. 2.

Referring also to FIGS. 2 and 3, FIG. 2 shows a microelectronic device 200 with a high voltage capacitor formed by an upper capacitor plate 202, a lower conductive capacitor plate 204, and an intervening dielectric material 206. The capacitor in FIG. 2 is formed over a substrate 208 with a field oxide structure 210 below the lower capacitor plate 204. A faraday cage structure 212 is spaced from a side of the capacitor. FIG. 2 shows example equipotential lines 214 when the upper capacitor plate 202 is at a high voltage relative to the voltage of the lower capacitor plate 204. The electric filed strength is high where the equipotential lines 214 are close to one another in the dielectric material 206 near the lateral bottom edge of the upper capacitor plate 202. FIG. 3 shows a graph 300 that illustrates an electric field strength curve 301 the electric field strength 301 reaches a significant peak at a distance D1 at the lateral edge of the upper capacitor plate 202. To avoid dielectric material breakdown, the capacitor of FIG. 2 is oversized for a given breakdown voltage rating such that the peak in the curve 301 is below the breakdown voltage threshold of the dielectric material 206.

Returning to FIG. 1, providing the floating plate 120 in the high-voltage component 101 advantageously reduces the electric field levels near the bottom corners of the high voltage node 130 compared with the capacitor design without the floating plate 120 (e.g., FIG. 2). The high voltage node 130 has a first lateral dimension 131 (e.g., the width along the X direction in FIG. 1). The low voltage node 111 has a second lateral dimension 132, and the first conductive plate 120 has a third lateral dimension 133. In the example of FIG. 1, the floating plate 120 is wider than the high voltage node 130 (the floating plate width dimension 133 is greater than the upper capacitor plate width dimension 131). In addition, the floating plate 120 is closer to the upper capacitor plate 130 than to the lower capacitor plate 111. In various implementations, the relative size and location of the floating plate 120 relative to the capacitor plates 111 and 130 can be tailored to control the electric field strength in the first and second dielectric materials 104 and 123 to meet a given voltage breakdown rating level without requiring oversizing of the capacitor 101. This advantageously conserves area in the microelectronic device 100, whether a standalone high voltage component product or an integrated circuit.

Figure 4:
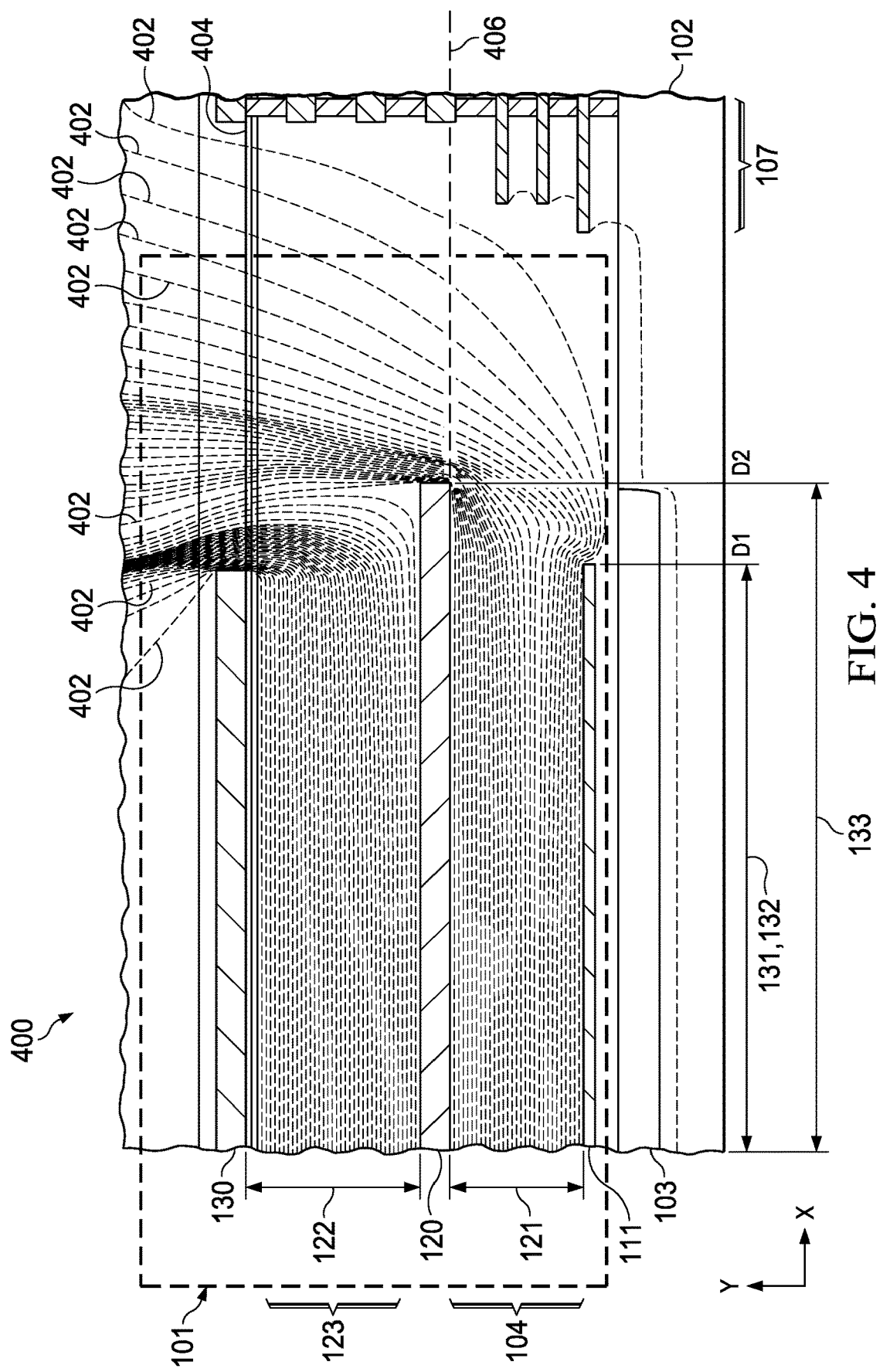
FIG. 4 is a partial sectional side elevation view showing another example microelectronic device including a high voltage capacitor with a floating plate between high and low voltage, upper and lower capacitor plates illustrating equipotential lines.

Referring now to FIGS. 4 and 5, FIG. 4 shows another example microelectronic device 400 including a high voltage capacitor 101 with a floating plate 120 between the high and low voltage nodes 130 and 111. FIG. 4 also shows equipotential lines 402 when the high voltage node 130 is at a high voltage relative to the voltage of the low voltage node 111. The capacitor 101 is generally as described hereinabove. In this example, the floating plate 120 is closer to the low voltage node 111 than to the high voltage node 130. The thickness dimension 122 of the second dielectric 123 (along the Y direction) is greater than the thickness dimension 121 of the first dielectric 104. In addition, the lateral width dimension 133 of the floating plate 120 (along the X direction in FIG. 4) is greater than the lateral width dimensions 131 and 132 of the high and low voltage nodes 130 and 111.

FIG. 5 provides a graph 500, which shows the corresponding electric field strength at two example dielectric locations as a function of the lateral position (along the X direction) in the capacitor dielectrics 123 and 104 in the capacitor of FIG. 4. In particular, a first curve 501 in FIG. 5 shows the electric field strength as a function of X direction position at a vertical position 404 (FIG. 4) in the second dielectric 123 just beneath the high voltage node 130. The curve 501 includes a peak at a first distance D1 corresponding to the lateral edge of the high voltage node 130. A second curve 502 in FIG. 5 shows the electric field strength as a function of the X direction position at a second vertical position 406 (FIG. 4) in the first dielectric 104 just beneath the floating plate 120. The curve 502 includes a peak at a second distance D2 corresponding to the lateral edge of the floating plate 120. The wider floating plate 120 in this example (like the example of FIG. 1 hereinabove) tends to extend the equipotential lines 402 laterally outward to reduce the equipotential line crowding near the bottom lateral edge of the high voltage node 130. The lateral extent of the floating plate 120 can be tailored in order to adjust the peaks in the electric field strength of the capacitor dielectrics 104 and 123, so that all peak levels (e.g., including the peaks in the curves 501 and 502) are below a breakdown tolerance level for a given dielectric material and a given operational voltage rating of the capacitor 101.

Figure 6:
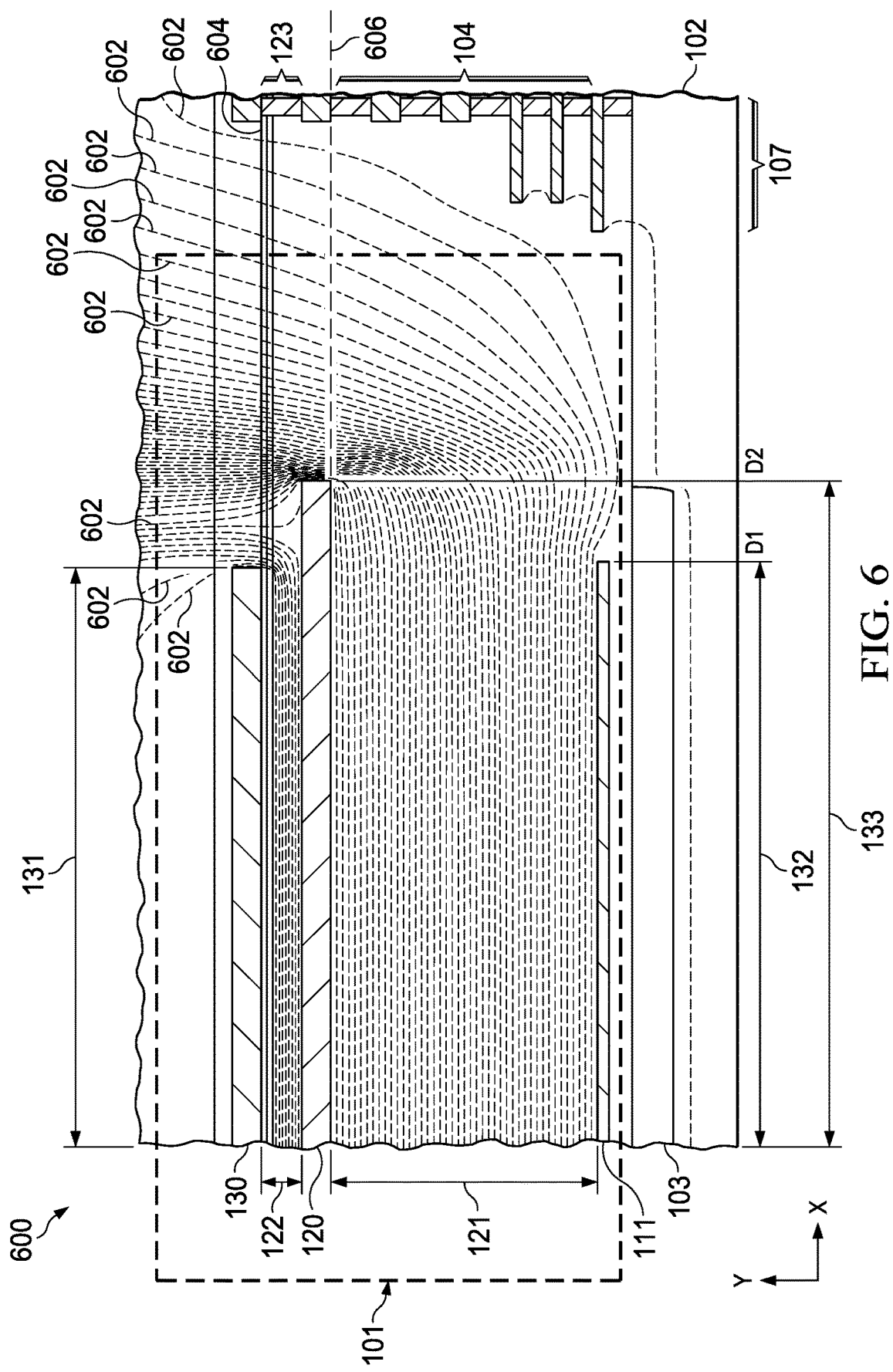
FIG. 6 is a partial sectional side elevation view showing another example microelectronic device including a high voltage capacitor with a floating plate between high and low voltage, upper and lower capacitor plates illustrating equipotential lines.
Figure 7:
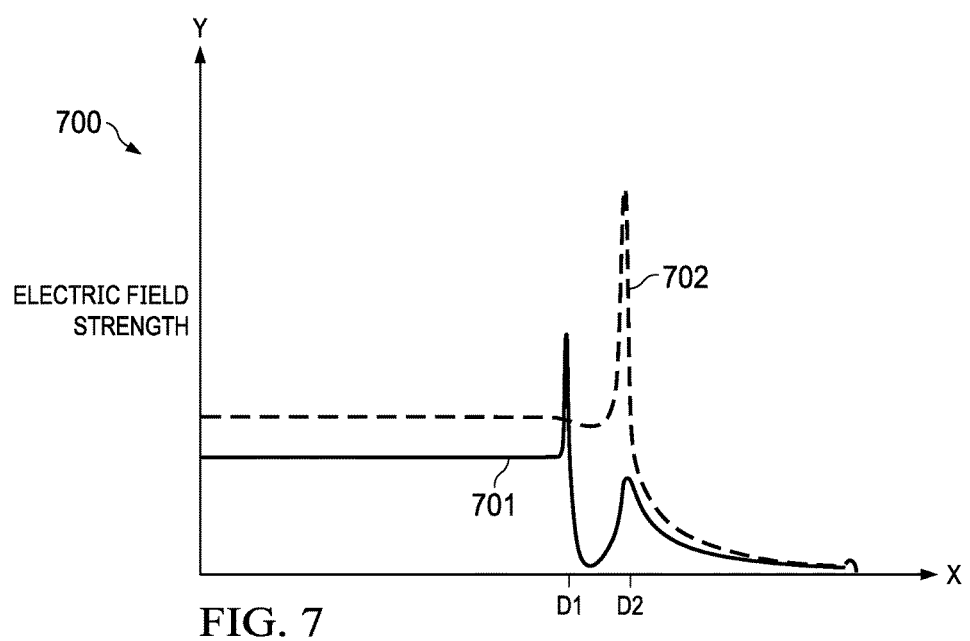
FIG. 7 is a graph of electric field strength as a function of lateral distance in the capacitor dielectric beneath the high voltage capacitor plate of FIG. 6.

Referring now to FIGS. 6 and 7, another example microelectronic device 600 is illustrated, including a high voltage capacitor 101 including a high voltage node 130, a low voltage node 111, first and second dielectrics 104 and 123, and a floating plate 120 generally as described above. FIG. 6 also shows equipotential lines 602 when the high voltage node 130 is at a higher voltage than the low voltage node 111. In this example, the floating plate 120 is closer to the high voltage node 130 than to the low voltage node 111. The thickness dimension 122 of the second dielectric 123 (along the Y direction) is less than the thickness dimension 121 of the first dielectric 104. Like the example of FIG. 4, the lateral width dimension 133 of the floating plate 120 (along the X direction in FIG. 6) is greater than the lateral width dimensions 131 and 132 of the high and low voltage nodes 130 and 111.

FIG. 7 shows a graph 700 of electric field strength at two example dielectric locations 604 and 606 as a function of the lateral position (along the X direction) in the capacitor dielectrics 123 and 104 in FIG. 6. The graph 700 includes a first curve 701 that shows the electric field strength at the vertical position 604 (FIG. 4) in the second dielectric 123 just beneath the high voltage node 130. The first curve 701 includes a peak at a first distance D1 corresponding to the lateral edge of the high voltage node 130. The graph 700 includes a second curve 702 that shows the electric field strength at the second vertical position 606 in the first dielectric 104 just beneath the floating plate 120. The curve 702 includes a peak at a second distance D2 corresponding to the lateral edge of the floating plate 120. The floating plate 120 in FIG. 6 extends the equipotential lines 602 laterally outward to reduce the equipotential line crowding near the bottom lateral edge of the high voltage node 130. In this case, the electric field strength peak in the curve 702 in the first dielectric 104 under the floating plate 120 is higher than the peak in the curve 701 under the high voltage node 130.

Figure 8:
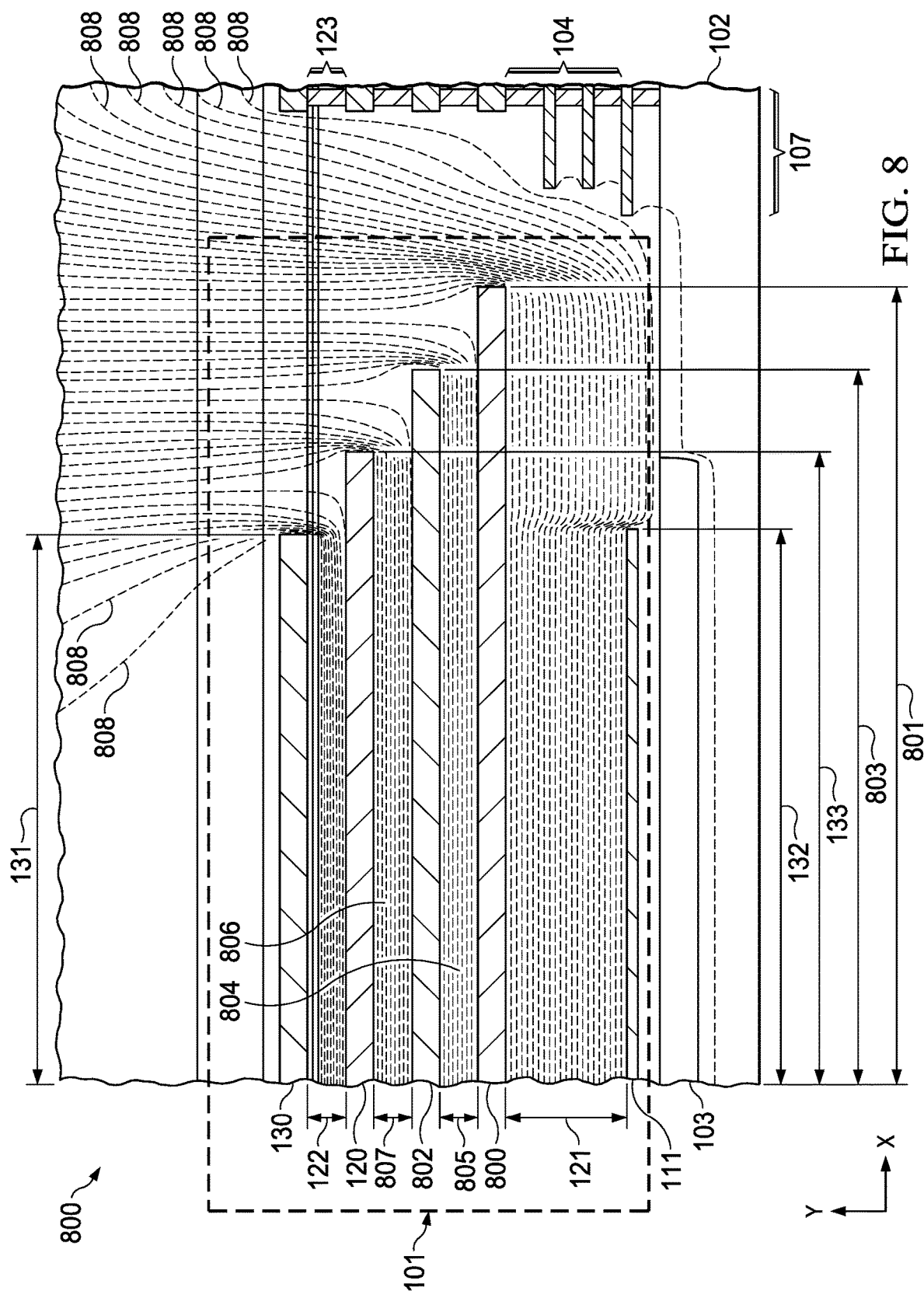
FIG. 8 is a partial sectional side elevation view showing yet another example microelectronic device including a high voltage capacitor with multiple floating plates between high and low voltage, upper and lower capacitor plates illustrating equipotential lines.

Referring now to FIG. 8, in further examples, two or more floating plates can be included between the high and low voltage nodes 130 and 111. FIG. 8 shows another example microelectronic device with a high voltage capacitor 101 as generally described above. In this example, the high voltage capacitor 101 includes multiple floating plates 800, 802, and 120 between the capacitor plates 130 and 111. This example also includes further dielectric layers 804 and 806. In addition, the floating plates 800, 802, and 120 have different lateral lengths 133, 803, and 801, respectively. In this example, the capacitor 101 includes a first dielectric 104 with a depth dimension 121 between the low voltage node 111 and the lowermost floating plate 800. In addition, the second dielectric 123 is disposed between the high voltage node 130 and the first floating plate 120, with a thickness dimension 122. The second floating plate 802 in this example is disposed between the first floating plate 120 and the first dielectric 104. In addition, the second floating plate 802 in this example has a longer lateral dimension 803 than the first floating plate 120. A third dielectric 806 with a thickness dimension 807 is disposed between the first floating plate 120 and the second floating plate 802. The third floating plate 800 has a lateral dimension 801 that is longer than the second floating plate 802. A fourth capacitor dielectric 804 with a thickness dimension 805 is formed between the second and third floating plates 802 and 800. FIG. 8 shows equipotential lines 808 for operation with the high voltage node 130 at a higher voltage than the low voltage node 111. The equipotential lines 808 in FIG. 8 exhibit crowding that indicates high electric field strength at the lateral ends of the floating plates 800, 802 and 120. In addition, as in the above examples, the presence of the floating plates 800, 802 and 120 tends to reduce the equipotential line crowding near the lateral end of the high voltage node 130.

The use of one or more floating plates 120, 800, 802 in the above examples advantageously controls the field distribution of the high voltage electronic component 101. Specific designs can be tailored to reduce the magnitude of the high electric field points in the capacitor 101 to improve a maximum voltage rating of the resulting high voltage capacitor 101 and/or to reduce the size of the capacitor 101 for a given maximum voltage rating. In this manner, forming the conductive floating plate 120 enhances the capacitance density of the microelectronic device. In addition, certain implementations using floating plates can advantageously increase the electric field between the plates, and away from the lateral edges thereof, to thereby increase the capacitance of the high voltage component 101. The disclosed examples can be used in connection with any type or types of capacitor dielectric materials and any suitable conductive plate materials. Some embodiments can be fabricated as part of an integrated circuit fabrication process, in which one or more metallization layer masks are selectively modified to provide one or more floating plates 120, 800, 802 between select metallization layers or levels. Such mask modifications, moreover, can be designed to provide any desired lateral floating plate dimensions to tailor a given design for specific dielectric material breakdown voltage ratings and capacitor operating voltage levels. In one example, the above described microelectronic devices can be fabricated by forming a conductive first capacitor plate (e.g., the low voltage node 111) above a substrate (e.g., semiconductor substrate 102), and forming a first dielectric (e.g., dielectric 104) over the conductive lower plate 111. The first dielectric can be formed as a plurality of dielectric layers (e.g., 108, 114-117). The example fabrication process further includes forming a conductive first floating plate (e.g., the floating plate 120) over the first dielectric 104, forming a second dielectric (e.g., 123) over the first floating plate 120, and forming a conductive second capacitor plate (e.g., high voltage node 130) over the second dielectric 123. As shown above in FIG. 1, the fabrication process can also include forming an isolation break 107 in the first dielectric 104 so that the first dielectric 104 is not continuous at the isolation break, and the isolation break 107 surrounds the first floating plate 120. In certain embodiments, the fabrication process can also include forming one or more low-voltage components (e.g., transistor 109 in FIG. 1) on or in the substrate 102.

Modifications are possible in the described embodiments, and other embodiments are possible, within the scope of the claims.

The invention claimed is:
1. A microelectronic device, comprising:
a first voltage plate of a first voltage component of the microelectronic device, the first voltage plate having a first end on a first side and a second end on a second, opposite, side;
a second voltage plate of the first voltage component, the second voltage plate having a first end on the first side and a second end on the second side;
a first dielectric layer disposed between the second voltage plate and the first voltage plate;
a first conductive plate disposed between the first dielectric layer and the first voltage plate, wherein the first conductive plate is floating, the first conductive plate has a first end on the first side that extends past the first end of the first voltage plate, the first conductive plate has a second end on the second side that extends past the second end of the first voltage plate, the first end of the second voltage plate is not beyond the first end of the first conductive plate, and the second end of the second voltage plate is not beyond the second end of the first conductive plate; and
a second dielectric layer disposed between the first conductive plate and the first voltage plate.

2. The microelectronic device of claim 1, wherein the first voltage component is a high voltage capacitor, the second voltage plate is a lower plate of the high voltage capacitor, the first voltage plate is an upper plate of the high voltage capacitor, and the first conductive plate is electrically isolated from the second voltage plate and the first voltage plate.

3. The microelectronic device of claim 1, wherein the first dielectric layer has a first thickness, the second dielectric layer has a second thickness, and the first thickness is different than the second thickness.

4. The microelectronic device of claim 1, wherein the first dielectric layer comprises a plurality of dielectric layers comprising silicon dioxide-based dielectric material.

5. The microelectronic device of claim 1, further comprising an isolation break in the first dielectric layer so that the first dielectric layer is not continuous at the isolation break, and the isolation break surrounds the first conductive plate.

6. The microelectronic device of claim 4, further comprising a second voltage component disposed outside of the isolation break.

7. A capacitor, comprising:
a conductive first capacitor plate disposed above a substrate and having a first edge on a first side and a second end on a second, opposite, side;
a first dielectric layer disposed over the conductive first capacitor plate;
a conductive first floating plate disposed over the first dielectric layer and having a first edge on the first side and a second end on the second side, the conductive first floating plate being electrically isolated from the conductive first capacitor plate;
a second dielectric layer disposed over the conductive first floating plate; and
a conductive second capacitor plate disposed over the second dielectric layer and having a first edge on the first side and a second end on the second side, the conductive second capacitor plate being electrically isolated from the conductive first floating plate, wherein the first edge of the conductive first floating plate extends beyond the first edge of the conductive second capacitor plate and as far as the first edge of the conductive first capacitor plate, and the second edge of the conductive first floating plate extends beyond the second edge of the conductive second capacitor plate and as far as the second edge of the conductive first capacitor plate.

8. The capacitor of claim 7, wherein the first dielectric layer has a first thickness, the second dielectric layer has a second thickness, and the first thickness is different than the second thickness.

9. The capacitor of claim 7, wherein the first floating plate has a lateral dimension that is different than a lateral dimension of the first capacitor plate.

10. The capacitor of claim 7, wherein the first dielectric layer comprises a plurality of dielectric layers comprising silicon dioxide-based dielectric material.

11. A microelectronic device, comprising:
   a capacitor having:
      a first capacitor plate disposed above a substrate, the first capacitor plate having a first lateral dimension in a first direction;
      a first dielectric layer disposed over the first capacitor plate;
      a conductive first floating plate disposed over the first dielectric layer, the conductive first floating plate having a second lateral dimension in the first direction, the conductive first floating plate being electrically isolated from the first capacitor plate, wherein the first capacitor plate does not extend beyond the conductive first floating plate;
      a second dielectric layer disposed over the conductive first floating plate; and
      a second capacitor plate disposed over the second dielectric layer, the second capacitor plate having a third lateral dimension in the first direction, wherein the second lateral dimension is greater than the third lateral dimension and at least as long as the first lateral dimension, the second capacitor plate is electrically isolated from the first capacitor plate and from the conductive first floating plate, and the conductive first floating plate extends past the second capacitor plate on two opposite sides along the first lateral direction.

12. The microelectronics device of claim 1, wherein the first dielectric layer has an interconnect structure and a via embedded therein.

13. The capacitor of claim 7, wherein the first dielectric layer has an interconnect structure and a via embedded therein.

14. The microelectronics device of claim 11, wherein the first dielectric layer has an interconnect structure and a via embedded therein.

15. The microelectronics device of claim 1, wherein the first dielectric layer comprises multiple dielectric layers each with an interconnect structure and a via embedded therein.

16. The capacitor of claim 7, wherein the first dielectric layer comprises multiple dielectric layers each with an interconnect structure and a via embedded therein.

17. The microelectronics device of claim 11, wherein the first dielectric layer comprises multiple dielectric layers each with an interconnect structure and a via embedded therein.

* * * * *